United States Patent [19]
Abt et al.

[11] Patent Number: 4,559,525
[45] Date of Patent: Dec. 17, 1985

[54] FAST INDEXING ENCODER APPARATUS

[75] Inventors: Edgar J. Abt, Tempe; Phillip D. Van Buren, Scottsdale; James P. Witter, Tempe, all of Ariz.

[73] Assignee: Motorola, Inc., Schaumburg, Ill.

[21] Appl. No.: 534,872

[22] Filed: Sep. 22, 1983

[51] Int. Cl.⁴ .............................................. G08C 9/00
[52] U.S. Cl. ................................................. 340/347 P
[58] Field of Search ................... 340/347 P, 347 DD; 250/231 SE

[56] References Cited

U.S. PATENT DOCUMENTS

| 3,721,806 | 3/1973 | Stothart | 340/347 P |
| 4,031,386 | 6/1977 | Recker | 340/347 P |
| 4,475,034 | 10/1984 | Maddox et al. | 340/347 P |

Primary Examiner—William M. Shoop, Jr.
Assistant Examiner—Sharon D. Logan
Attorney, Agent, or Firm—Eugene A. Parsons

[57] ABSTRACT

A plurality of rings each having gear teeth in the outer periphery thereof and rotatably mounted for individual rotation, each ring having associated therewith a fixed electrical contact and a wiper contact for engaging a plurality of fixed contacts as the ring rotates. A drive gear associated with each of said rings and driven from a single control, said drive gears being mounted so that only one gear is engaged with its associated ring at any one time and the drive gear to be engaged is selected by means of a ratchet and pawl that operates from a single locking control and rotates a wheel having escarpments thereon for moving the drive gears axially into engagement with the rings.

9 Claims, 7 Drawing Figures

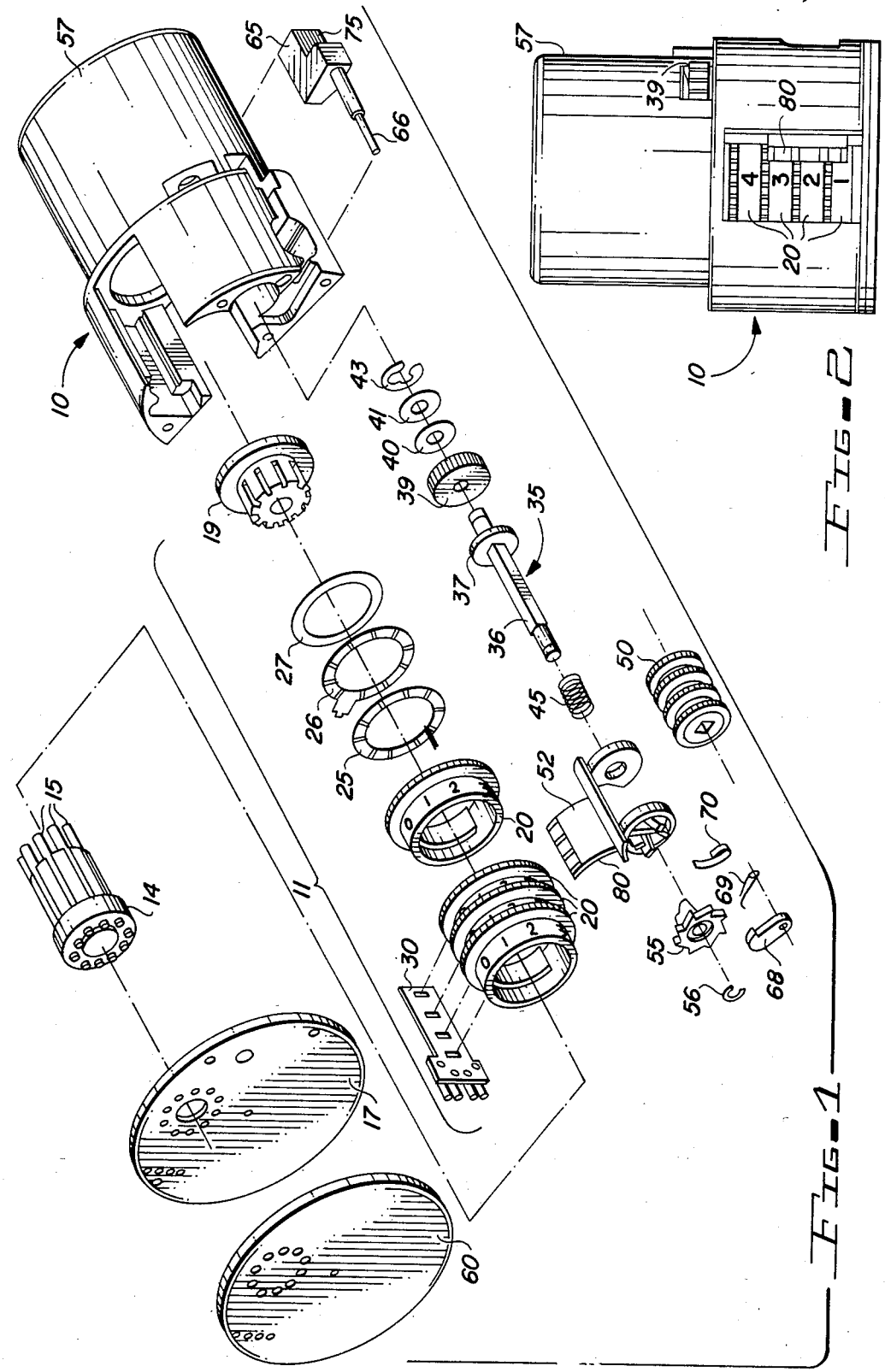

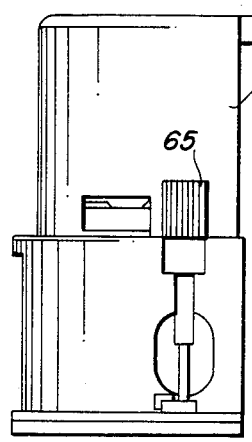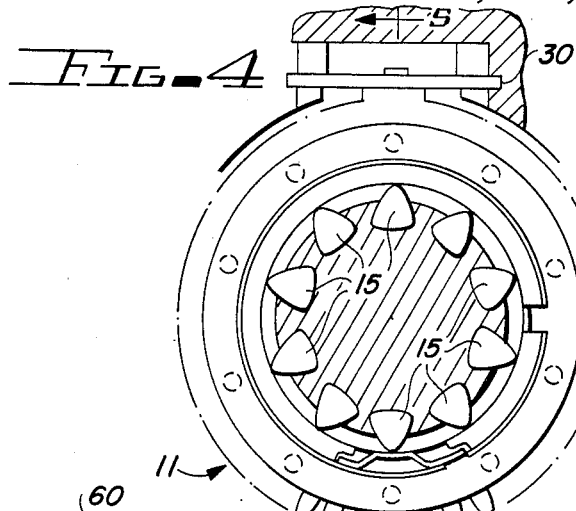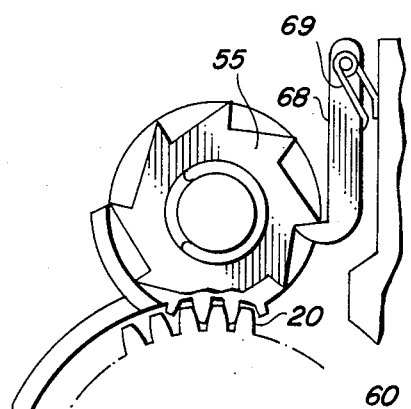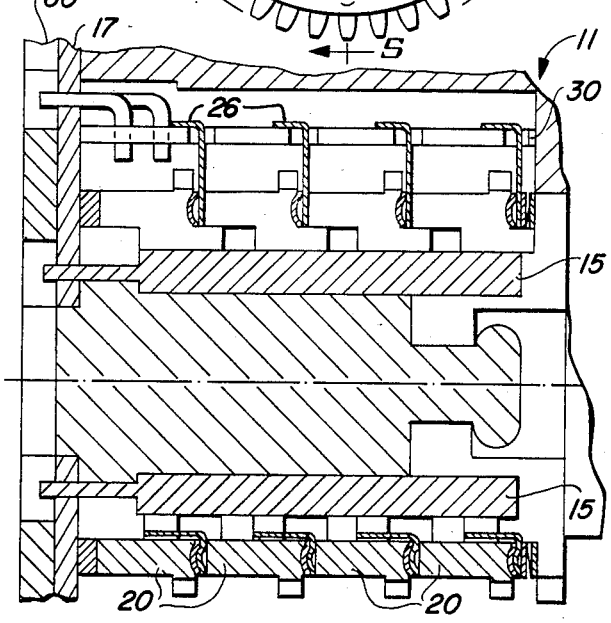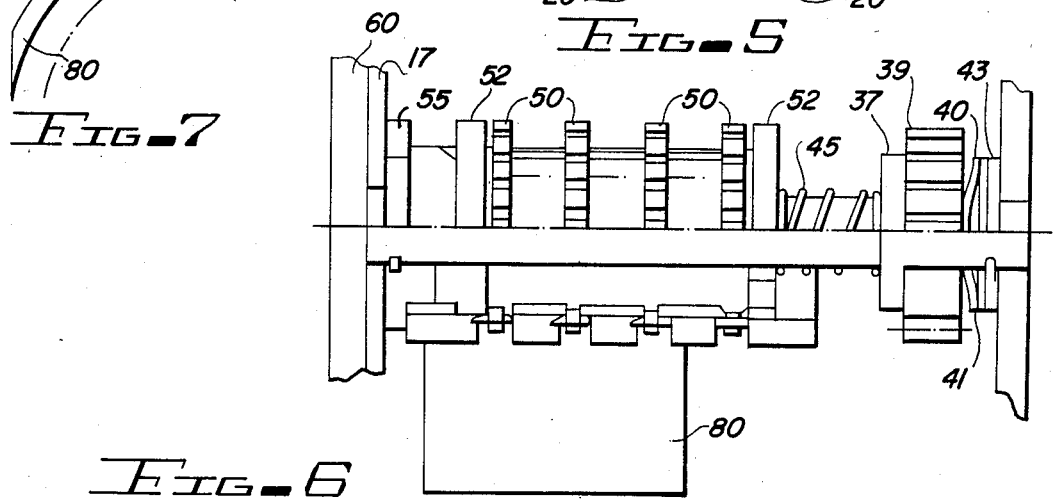

FAST INDEXING ENCODER APPARATUS

BACKGROUND OF THE INVENTION

In the context of this invention, electromechanical encoders provide the means to convert a unique mechanical setting into a unique electrical interpretation, thereby providing a one-on-one mapping function. In some encoder designs the operator must cause the mechanism to advance sequentially through all numbers smaller than the desired number in order to obtain the prescribed set point. This is not an objectionable practice for set points near the lower end of the range, but when the set point is a considerable distance upscale then the time to set the mechanism could become objectionable. A second potential drawback to sequential advance of setting would occur if electrical contact make/break action is associated with each change of the least significant digit. In that instance one element of the contact pair could be subjected to rapid wear or fatigue loading. The Fast Indexing Encoder Apparatus provides the means to avoid those objections.

SUMMARY OF THE INVENTION

The present invention pertains to a fast indexing encoder apparatus wherein a plurality of rotatably mounted members each have associated therewith a fixed contact and a sliding contact which engages one of a plurality of conductors as the member is rotated, and selection means including a common control coupled to said plurality of members for selectively rotating each of said members so that the associated sliding contact is engaged with the desired conductor.

It is an object of the present invention to provide new and improved fast indexing encoder apparatus.

It is a further object of the present invention to provide new and improved fast indexing encoder apparatus which is relatively simple to manufacture and operate.

These and other objects of this invention will become apparent to those skilled in the art upon consideration of the accompanying specification, claims and drawings.

BRIEF DESCRIPTION OF THE DRAWINGS

Referring to the drawings, wherein like characters indicate like parts throughout the figures;

FIG. 1 is an exploded view in perspective of fast indexing encoder apparatus embodying the present invention;

FIG. 2 is a view in front elevation of the assembled encoder apparatus of FIG. 1;

FIG. 3 is a view in side elevation as seen from the right side of FIG. 2;

FIG. 4 is a view in end elevation of an assembled portion of the apparatus illustrated in FIG. 1;

FIG. 5 is a sectional view has seen from the line 5—5 in FIG. 4;

FIG. 6 is a view of an assembled portion of the apparatus in FIG. 1, portions thereof broken away; and FIG. 7 is a view in end elevation as seen from the left end of FIG. 6.

DESCRIPTION OF THE PREFERRED EMBODIMENT

Referring specifically to FIG. 1, a housing generally designated 10 has a plurality of cavities therein opening to the left in FIG. 1 to receive the various exploded components in an assembled configuration. One of the assembled components which fits within a cavity in the housing 10 is an encoder 11 including the following parts. An encoder cylinder lower portion 14 includes 10 elongated conductors 15 having an electrical connection extending outwardly from the cylinder 14 at the left end thereof and designed to be engaged in a disc-shaped printed wiring board 17. The opposite end of the elongated conductors 15 are designed to be engaged in slots in an upper portion of the encoder cylinder 19. A plurality of members, in this embodiment four rings 20, are rotatably mounted around the cylinder 14 and each ring is fashioned with gear teeth in an outer periphery thereof. The rings also carry indices, or marks to indicate their rotational position. Two washers 25 and 26 are associated with each of the rings (20) to provide electrical contact and to insure easy rotation. The ring 25 contains a sliding contact which is positioned to engage only one of the conductors 15 on the cylinder 14 as the associated ring 20 is rotated. A complete rotation of the associated ring 20 results in the sliding contact of the washer 25, which is keyed to the associated ring to enable it to rotate with the ring 20 and engage each of the conductors 15 in turn. The second washer 26 has an integral stabilizing arm formed thereon which engages a printed wiring board 30 to provide a fixed contact to the encoder. The ring and both washers are dimpled to provide a detent to aid the operator in making proper alignment of the encoder. A wave washer 27 provides axial force on the stack of rings 20 and washers 25 and 26 to ensure contact between the four sets of washers 25, 26 in the stack. The four fixed contacts of the washers 26, associated with each of the rings 20, are connected by way of the printed wiring board 30 to the printed wiring board 17. The entire assembled encoder apparatus is illustrated in greater detail in FIGS. 4 and 5.

The encoder 11 is operated by selection apparatus which includes a common control for individually rotating each of the rings 20. The selection apparatus is designed to be inserted in a cavity in the housing 10 adjacent the cavity containing the encoder 11 and to engage the gears in the outer periphery of the rings 20 for the preselected rotation thereof. The selection apparatus is mounted on a shaft 35 which includes a square portion 36 and an integral shoulder 37. A drive gear 39 is constructed to fit on the shaft 35 and engage the shoulder 37 in a clutching action. A wave washer 40 and standard washer 41 are positioned over the shaft 35 adjacent the drive gear 39 to spring load the drive gear 39 into the shoulder 37. A retaining clip 43 is then engaged in a groove in the shaft 35 to retain the mechanism in the position described.

At the opposite side of the shoulder 37 a spring 45 is positioned axially over the shaft 35. A gear cluster assembly 50 including four gears fixedly connected together so that only one gear can engage one of the rings 20 at a time, is designed to fit within an indicator cage 52. The cage 52 is designed with a washer-like shoulder fixedly attached at either end thereof and positioned to receive the gear cluster 50 therebetween. The gear cluster 50 and cage 52 are then positioned on the shaft 35 so that the gear cluster 50, which has a square hole therethrough is engaged by the square portion 36 of the shaft 35 and rotates therewith. The cage 52 is held in place rotationally by the housing 10 so that it does not rotate with the shaft 35 but is free to move axially therealong. The left hand washer or end of the cage 52 has an axially outwardly extending four-step, two cycle escarpment, or cam, formed thereon as an integral part of the cage 52. A ratchet gear 55 is positioned on the end of the shaft 35 and has an opposite four-step, two cycle escarpment, or cam surface, formed integrally thereon on the inside of the surface so as to engage the cam surface of the cage 52. A retaining clip 56 is then engaged in a groove in the end of shaft 35 to retain the entire assembly on the shaft 35.

When the selection apparatus is positioned in the proper cavity of the housing 10 the drive gear 39 engages the teeth of an internal gear (not shown) whose guide surface locates on surface 57 of housing 10. The internal gear is rotatably affixed on the housing 10 to provide a large, convenient common control for rotating any of the rings 20 through the gear cluster 50, and the drive gear 39. The outermost end of the shaft 35 is engaged in an opening in the printed wiring board 17 and in an opening (not shown) in the inside surface of a disc-shaped insulating encoder base 60.

The selection apparatus is operated by means of a single control which includes a lock 65 having a shaft 66 extending outwardly therefrom. A lever or pawl 68 and a spring 69 are rotatably mounted on the shaft 66 and engaged with the ratchet gear 55. An anti-rotation spring lock 70 is also mounted in the housing in an engagement with the ratchet 55 to provide the usual ratchet action. The lock 65 is mounted in the housing 10 so that each time it is depressed inwardly and subsequently released the pawl 68 rotates the ratchet 55 one tooth during execution of the release stroke. In the present embodiment the ratchet 55 has 8 teeth. Two cam cycles of four steps each are arrayed on one face of the ratchet 55 so that two ratchet teeth are associated with each of the steps on the cam. The lock 65 also has gear teeth 75 on an outwardly facing surface thereof which gear teeth engage the teeth of the internal gear when shaft 66 is at its farthest position from the center line of housing 10. The lock 65 is urged outwardly by a spring, not shown, which causes the teeth 75 to engage the teeth of the internal gear and lock the internal gear against rotation. When the lock 65 is depressed by an operator the internal gear is released for rotation and the specific ring 20 in engagement with one of the gears in the cluster 50 is rotated by rotation of the internal gear. When the lock 65 is released the ratchet 55 turns one tooth and the cam on the reverse surface thereof forces the cage 52 axially along the shaft 35 so that the next gear in the cluster 50 engages the next one of the rings 20. In this fashion each of the rings 20 of the encoder mechanism can be quickly and easily indexed. The internal gear mounted on the housing 10 can be rotated in either direction to set the rings 20 so that a limited amount of time and effort is required for the indexing.

The cage 52 also contains an indicator 80 which extends into a window in the housing 10 and operates as a pointer to indicate which of the rings 20 is being indexed. The indicator 80 has four marks thereon, one of which points to the number on the ring 20 which is being indexed. For example, in FIG. 2 the lowermost mark on the indicator 80 is aligned with the number 1 to indicate that the first ring is the one to be addressed by rotation of the internal gear mounted on housing 10 when lock 65 is depressed. The window in the housing 10 has a lens fitted therein (not shown) which overlies the indicator 80 and allows only the proper aligned mark on the indicator 80 to be visible to an operator. This is efficiently accomplished by having the portion of the lens which overlies the indicator 80, (see FIG. 2), to be opaque except for four lines which are aligned with the numbers on the four rings 20. As the cage 52 and, consequently, the indicator 80 are cammed along the shaft 35 the second line on the indicator 80 becomes aligned with the number 2 and becomes visible in the second line in the opaque lens, the third line on the indicator 80 becomes aligned with the number 3 and becomes visible in the opaque portion of the lens and eventually (after 3 depressions and releases of the lock 65) the fourth line on the indicator 80 becomes aligned with the number 4 and is visible through the fourth line in the opaque portion of the lens. After the lock 65 is depressed and released 4 times the cam on the ratchet 55 has rotated one half turn and the cage 52 is returned to the leftmost position by the spring 45 for recycling during the second half turn of ratchet 55. The completely assembled selection apparatus is illustrated in FIGS. 6 and 7.

The encoder cylinder assembly 14 contains 10 vertical electrical conductor elements 15 located at 36 degree intervals around its periphery. This assembly is encompased by the four independent ring assemblies. Each ring 20 has an associated wiper 25 that rotates with the ring and provides electrical contact between the wiper and one of the ten conductor elements on the cylinder 14. The four rings 20 may, for example, provide for independent time settings of hundreds, tens, units, and tenths decades. Because only ten electrical conductor elements 15 are provided, power is applied to the fixed contact 26 of each ring 20 sequentially be means of logic circuitry (not shown) and the output from the ten conductor elements 15 is gated to a proper counter stage in a digital integrated circuit corresponding to the ring to which power has been applied. For example, if power is applied to the units ring the ten conductor elements are connected to the units counter stage in the integrated circuit. When power is applied to the next ring of the encoder, the conductor elements are in turn switched to the next counter stage. All of the switching is accomplished electronically within an integrated circuit associated with the encoder. This method allows the same ten conductor elements to program all four counter stages and therefore greatly reduces the number of wires to interconnect between the encoder and the electronic assembly. The combination of the four rings 20 and the ten conductor elements 15 provides a potential of 10,000 unique settings.

Thus, fast indexing encoder apparatus is described and illustrated which requires less electrical connections than prior art structures and is simple to manufacture as well as operate. The various rings of the encoder can be indexed with a minimum of operator manipulation. Further, the indicating apparatus provides a postive indication of the specific portion of the encoder being indexed. While the apparatus is illustrated with electromechanical contacts it will of course be understood by those skilled in the art that non-contact means might be utilized such as, for example, capacitive, Hall-effect, etc.

While we have shown and described a specific embodiment of this invention, further modifications and improvements will occur to those skilled in the art. We desire it to be understood, therefore, that this invention is not limited to the particular form shown and we intend in the appended claims to cover all modifications which do not depart from the spirit and scope of this invention.

We claim:

1. Fast indexing encoder apparatus comprising:
a plurality of rotatably mounted members each having associated therewith encoding means including a plurality of individually selectable indices; and
selection means including a common control coupled to said plurality of members for selectively rotating any selected one of said plurality of members independent of the other members, to a preselected one of said indices.

2. Fast indexing encoder apparatus as claimed in claim 1 wherein the plurality of members and associated encoding means each include a rotatably mounted ring having a single input/output electrical contact attached thereto and a plurality of output/input electrical contacts each being individually connected to said single input/output contact by a predetermined amount of rotation of said ring.

3. Fast indexing encoder apparatus as claimed in claim 2 wherein the single input/output electrical contact is a fixed contact and the plurality of output/input electrical contacts include a wiper contact rotatable with said ring and electrically connected to said fixed contact and further include a plurality of fixed electrical contacts positioned to be individually engaged by said wiper contact as the ring is rotated the predetermined amount.

4. Fast indexing encoder apparatus as claimed in claim 3 wherein the plurality of fixed electrical contacts associated with each rotatably mounted ring include a single plurality of elongated contacts.

5. Fast indexing encoder apparatus as claimed in claim 3 wherein each rotatably mounted ring has gear teeth formed in an outer periphery thereof and said rings are further mounted for selectively engaging a driving gear associated with the common control.

6. Fast indexing encoder apparatus as claimed in claim 5 wherein a driving gear is included for each of said plurality of rotatably mounted rings and the selection means includes means for mounting the driving gears so that only one driving gear engages its associated ring at any time, said selection means further including stepping means for moving each driving gear into engagement with its associated ring in turn.

7. Fast indexing encoder apparatus as claimed in claim 6 wherein the stepping means includes a ratchet and pawl and a single control connected to said ratchet and pawl for operation thereof.

8. Fast indexing encoder apparatus as claimed in claim 7 wherein the single control further includes locking means for preventing operation of the common control when the single control is in an inoperative position.

9. Fast indexing encoder apparatus comprising:
a plurality of rotatably mounted members each individually rotatable;
each of said members having a fixed electrical contact associated therewith;
each of said members further having an electrical wiper contact connected to said fixed contact;
a plurality of electrical conductors mounted adjacent said members for sequential engagement with the wiper contacts of each of said members as said members are rotated, said conductors being further mounted so that each wiper engages only one conductor at any time; and
selection means including a common control coupled to said plurality of members for selectively rotating any selected one of said plurality of members individually to connect the associated fixed electrical contact to a preselected one of the plurality of electrical conductors.

* * * * *